United States Patent
Otremba et al.

(10) Patent No.: US 8,324,115 B2
(45) Date of Patent: Dec. 4, 2012

(54) SEMICONDUCTOR CHIP, SEMICONDUCTOR DEVICE AND METHODS FOR PRODUCING THE SAME

(75) Inventors: Ralf Otremba, Kaufbeuren (DE); Daniel Kraft, Klagenfurt-Viktring (AT); Alexander Komposch, Morgan Hill, CA (US); Hannes Eder, Villach (AT); Paul Ganitzer, Villach (AT); Stefan Woehlert, Villach (AT)

(73) Assignee: Infineon Technologies AG, Munich (DE)

( * ) Notice: Subject to any disclaimer, the term of this patent is extended or adjusted under 35 U.S.C. 154(b) by 569 days.

(21) Appl. No.: 11/555,891

(22) Filed: Nov. 2, 2006

(65) Prior Publication Data
US 2008/0105907 A1 May 8, 2008

(30) Foreign Application Priority Data
Nov. 2, 2005 (DE) .......... 10 2005 052 563

(51) Int. Cl.
*H01L 21/00* (2006.01)

(52) U.S. Cl. ........ 438/763; 438/620; 438/584; 438/106; 257/288; 257/684; 257/678; 257/E21.165

(58) Field of Classification Search .......... 257/213, 257/220, 236, 242, 263, 278, 302, 341, 735, 257/124, 288, 684, 678, 779, E21.165; 438/124, 438/106, 620, 584, 763
See application file for complete search history.

(56) References Cited

U.S. PATENT DOCUMENTS

| | | | | |
|---|---|---|---|---|
| 3,770,988 A | * | 11/1973 | Engeler et al. | 257/235 |
| 4,141,028 A | * | 2/1979 | Hulstrunk | 257/692 |
| 4,668,471 A | * | 5/1987 | Futatsuka et al. | 420/477 |
| 4,702,967 A | | 10/1987 | Black et al. | 428/620 |
| 5,108,027 A | * | 4/1992 | Warner et al. | 228/254 |

(Continued)

FOREIGN PATENT DOCUMENTS

DE 38 23 347 A1 1/1990

(Continued)

OTHER PUBLICATIONS

Flanders et al. "Activation . . . Substrates" J. Elect. Mater. vol. 26, No. 7 (1997).*

*Primary Examiner* — Brook Kebede
*Assistant Examiner* — Mark A Laurenzi
(74) *Attorney, Agent, or Firm* — Banner & Witcoff, Ltd.

(57) ABSTRACT

A semiconductor chip (1) is provided having an adhesion-promoting-layer-free three-layer metallization (2). The three-layer metallization (2) has an aluminum layer (4) applied directly on the semiconductor chip (1), a diffusion barrier layer (5) applied directly on the aluminum layer (4), and a solder layer (6) applied directly on the diffusion barrier layer (5). Ti, Ni, Pt or Cr is provided as the diffusion barrier layer (5) and a diffusion solder layer is provided as the solder layer (6). All three layers are applied by sputtering in a process sequence.

27 Claims, 1 Drawing Sheet

U.S. PATENT DOCUMENTS

| | | | |
|---|---|---|---|
| 5,388,328 A * | 2/1995 | Yokono et al. | 29/852 |
| 5,578,841 A * | 11/1996 | Vasquez et al. | 257/220 |
| 5,635,764 A * | 6/1997 | Fujikawa et al. | 257/766 |
| 5,901,901 A | 5/1999 | Schneegans et al. | 228/254 |
| 6,022,805 A * | 2/2000 | Sumi | 438/677 |
| 6,410,363 B1 * | 6/2002 | Tani et al. | 438/112 |
| 6,727,587 B2 | 4/2004 | Riedl | 257/748 |
| 2002/0047217 A1 * | 4/2002 | Zakel et al. | 257/781 |
| 2002/0056925 A1 * | 5/2002 | Kang et al. | 257/784 |
| 2002/0192874 A1 * | 12/2002 | Schatzler et al. | 438/124 |
| 2006/0057388 A1 * | 3/2006 | Jin et al. | 428/408 |

FOREIGN PATENT DOCUMENTS

| | | |
|---|---|---|
| DE | 195 28 441 A1 | 9/1996 |
| DE | 196 06 101 A1 | 8/1997 |
| DE | 101 24 141 A1 | 4/2002 |
| DE | 103 14 876 A1 | 11/2004 |

* cited by examiner

SEMICONDUCTOR CHIP, SEMICONDUCTOR DEVICE AND METHODS FOR PRODUCING THE SAME

CROSS-REFERENCE TO RELATED APPLICATIONS

This application claims priority from German Patent Application No. DE 10 2005 052 563.6, which was filed on Nov. 2, 2005, and is incorporated herein by reference in its entirety

TECHNICAL FIELD

The invention relates to a semiconductor chip, in particular a semiconductor chip having a diffusion solder layer, a semiconductor device and methods for producing the same.

BACKGROUND

Semiconductor chips, in particular power semiconductor chips, are often mounted on a circuit carrier by way of a diffusion solder connection. The semiconductor chip is provided with a metallization having an outer layer made of a diffusion solder. A connection between the semiconductor chip and the circuit carrier is produced by the formation of intermetallic phases at the boundary between the diffusion solder layer and the surface of the circuit carrier.

The intermetallic phases formed have a higher melting point than the melting point of the diffusion solder. Consequently, the production temperature of the connection is lower than the melting point of the connection formed. A diffusion solder connection thus has the advantage that it is thermally stable, and in particular thermally stabler than a soft solder connection. A diffusion solder connection is thus advantageous particularly in the case of power semiconductor devices.

A diffusion solder layer is typically provided as the outermost layer of a multilayer metallization on the semiconductor chip. DE 101 24 141 discloses a metallization having at least four layers. A buffer layer made of aluminum, a diffusion barrier layer, at least one adhesion promoter layer and a diffusion solder layer are provided.

This metallization structure is complicated and costly to produce. This metallization also has the disadvantage that the production of a connection between the semiconductor chip and the circuit carrier may be unreliable.

SUMMARY

It is an object of the invention, therefore, to provide a semiconductor chip having a metallization and also a method for producing the same which can be connected to a circuit carrier more simply and more reliably.

This object is achieved by means of the subject matter of the independent claims. Advantageous developments of the invention emerge from the dependent claims.

The invention specifies a semiconductor chip having an adhesion-promoting-layer-free three-layer metallization. The three-layer metallization comprises an aluminum layer applied directly on the semiconductor chip, a diffusion barrier layer applied directly on the aluminum layer, and a solder layer applied directly on the diffusion barrier layer. Ti, Ni, Pt or Cr is provided as the diffusion barrier layer and a diffusion solder layer is provided as the solder layer. All three layers are applied by sputtering in a process sequence. The three layers of the metallization have a respective function. The aluminum layer has the function of specifying a low-resistance contact with the silicon of the semiconductor chip. Aluminum has the advantage that the aluminum layer also has the effect of a buffer layer. Under loading caused by thermal cycling, aluminum exhibits liquid-like properties that can compensate for mechanical stresses between the semiconductor chip and a circuit carrier. The diffusion barrier layer has the function of preventing a diffusion reaction between the aluminum layer and the diffusion solder. The diffusion solder layer enables the semiconductor chip to be mounted on a surface by means of a diffusion solder composite.

The semiconductor chip according to the invention thus has a metallization having no adhesion promoting layer. The diffusion solder layer is applied by sputtering directly on the diffusion barrier layer. This structure has the advantage that fewer layers have to be applied, so that the production method is simplified.

In the case of metallization structures having an adhesion promoting layer, the adhesion promoting layer has the function of improving the adhesion between the diffusion barrier layer and the diffusion solder layer. However, the adhesion promoter layer has the disadvantage that this function is brought about by a reaction between the adhesion promoting layer and the diffusion solder layer. Owing to this reaction, intermetallic phases are formed from the material of the adhesion promoting layer and the material of the diffusion solder layer in the boundary region between the adhesion promoting layer and the diffusion solder layer. This reaction causes a change in the composition of the diffusion solder layer and may lead to a change in the diffusion solder layer properties, for example the melting point. The growth of the intermetallic phases is not very controllable. This has the consequence that the melting point of the diffusion solder layer and the optimum soldering temperature vary. Consequently, the further processing of the semiconductor chip is not reproducible. These problems are avoided by the semiconductor chip according to the invention with its adhesion-promoting-layer-free three-layer metallization. The semiconductor chip according to the invention can thus be mounted more reliably on a circuit carrier.

The diffusion solder layer can be applied directly on the diffusion barrier layer without an additional adhesion promoting layer since all three layers are applied by sputtering in a process sequence. All three layers are applied by sputtering without the semiconductor chip being exposed to the air in the meantime. This enables the diffusion solder layer to adhere directly on the diffusion barrier layer. Detachment of the diffusion solder layer is avoided by the high process purity of the single process sequence.

In one exemplary embodiment, the diffusion solder layer comprises an Sn-based diffusion solder. In particular, the diffusion solder layer may have AuSn, AgSn or CuSn. These diffusion solders have the advantage that their melting points are low, so that the functionality of the semiconductor chip is not impaired by the soldering temperature used. The composites produced by said diffusion solders have a sufficient high melting point, so that the connection between the semiconductor chip and the leadframe remains mechanically and electrically stable during normal operation.

The diffusion solder layer has a thickness c, where in one embodiment $0.1\ \mu m \leq c \leq 10\ \mu m$. The diffusion barrier layer has a thickness b, where in one embodiment $0.1\ \mu m \leq b \leq 10\ \mu m$. The aluminum layer has a thickness a, where in one embodiment $0.1\ \mu m \leq a \leq 10\ \mu m$. These thickness ranges are designed such that the thickness of the device does not have to be increased, and that a reliable metallization is obtained.

In a further embodiment, the boundary region between the diffusion solder layer and the diffusion barrier layer is free of intermetallic phases. This has the advantage that the composition of the diffusion solder layer is not changed by the formation of intermetallic phases. The composition of the diffusion solder layer on different semiconductor chips is thus essentially identical. This leads to a reproducible melting point and soldering temperature. Consequently, a more reliable connection between the semiconductor chip and the circuit carrier is specified.

In one exemplary embodiment, the semiconductor chip is a vertical power semiconductor device. The vertical power semiconductor device may be a MOSFET, an IGBT, a Schottky diode or a PIN diode.

In an alternative exemplary embodiment, the semiconductor chip has an active top side with integrated circuit elements and a passive rear side. The three-layer metallization is arranged on the passive rear side of the semiconductor chip.

A semiconductor device is also specified according to the invention. The semiconductor device according to the invention has a circuit carrier having at least one chip island and at least one semiconductor chip according to one of the preceding embodiments. The semiconductor chip is mechanically and electrically connected to the chip island by way of the adhesion-promoting-free three-layer metallization. The diffusion solder layer has intermetallic phases.

The intermetallic phases are formed from the material of the surface of the chip island and the material of the diffusion solder layer. The intermetallic phases comprise the elements of these two materials. The diffusion solder layer may react fully with the chip island, so that no diffusion solder remains in the semiconductor device. In this embodiment, the metallization comprises an aluminum layer provided directly on the semiconductor chip, a diffusion barrier layer provided directly on the aluminum layer, and an intermetallic layer provided directly on the diffusion barrier layer and directly on the chip island.

In an alternative embodiment, only a portion of the diffusion solder layer reacts with the chip island. In this embodiment, the metallization comprises an aluminum layer provided directly on the semiconductor chip, a diffusion barrier layer provided directly on the aluminum layer, a diffusion solder layer provided directly on the diffusion barrier layer, and an intermetallic layer provided directly on the diffusion solder layer and directly on the chip island.

In one embodiment, the chip island has Cu or a Cu-based alloy. In a further embodiment, a leadframe is provided as the circuit carrier. The leadframe has at least one chip island and a plurality of leads.

The semiconductor device may furthermore have additional electrical connections and a plastic housing composition. The electrical connections are arranged between the top side of the semiconductor chip and the leads of the leadframe and electrically connect the top side of the semiconductor chip to the leadframe. The plastic housing composition surrounds the semiconductor chip, the chip island, the electrical connections and inner regions of the leads and provides the housing of the semiconductor device.

One or a plurality of bonding wires or contact clips may be provided as electrical connections. A device may have bonding wires and a contact clip as electrical connections. Bonding wires may be used for example as control contact elements and a contact clip may be used as a supply contact element.

The semiconductor device may also have two or more semiconductor chips, which may in each case be provided with a three-layer metallization according to the invention. The two or more semiconductor chips may be mounted alongside one another on a single chip island by way of the metallization according to the invention. In an alternative embodiment, the device may have a circuit carrier having two or more chip islands. In this embodiment, a semiconductor chip or a plurality of semiconductor chips can be mounted on each of the plurality of chip islands.

The invention also relates to a method for producing a semiconductor chip having an adhesion-promoting-layer-free three-layer metallization. The method has the following steps. At least one semiconductor chip is provided and an aluminum layer is applied directly on the semiconductor chip. A diffusion barrier layer is applied directly on the aluminum layer and a solder layer is applied directly to the diffusion barrier layer. Ti, Ni, Pt or Cr is applied as the diffusion barrier layer and a diffusion solder layer is applied as the solder layer. All three layers are applied by sputtering in a process sequence.

The three-layer metallization according to the invention is advantageously applied by sputtering on a wafer having a plurality of semiconductor chips. A plurality of semiconductor chips are thereby produced simultaneously with the three-layer metallization according to the invention. The method can be carried out in a vacuum chamber having at least three separately controllable sources of desired materials. The three layers are applied by sputtering step by step with the desired sequence of layers without air being admitted into the chamber. This process sequence prevents the contamination of the metallization layers and improves the adhesion between adjacent layers of the stack. As an alternative, two or more sputtering chambers can be used. The semiconductor chips or the wafer can be transferred from a first vacuum chamber to a second vacuum chamber under vacuum.

The sputtering of the three-layer metallization in the process sequence prevents the detachment of the layers, and in particular the detachment of the diffusion solder layer from the diffusion barrier layer. An additional adhesion promoting layer can thus be dispensed with.

In one form of implementation, an Sn-based diffusion solder is applied by sputtering as the diffusion solder layer. The diffusion solder layer may have AuSn, AgSn, or CuSn.

The diffusion solder layer is applied by sputtering with a thickness c, where it may be the case that $0.1\ \mu m \leq c \leq 10\ \mu m$. The diffusion barrier layer is applied by sputtering with a thickness b, where it may be the case that $0.1\ \mu m \leq b \leq 10\ \mu m$. The aluminum layer is applied by sputtering with a thickness a, where it may be the case that $0.1\ \mu m \leq a \leq 10\ \mu m$. The deposition of the metallization according to the invention is carried out, in one form of implementation, such that the boundary region between the diffusion solder layer and the diffusion barrier layer is free of intermetallic phases. The composition of the diffusion solder layer is thereby provided reproducibly on a plurality of semiconductor chips of a wafer.

A vertical power semiconductor device may be provided as the semiconductor chip. As an alternative, the semiconductor chip may have an active top side and a passive rear side, the three-layer metallization being applied by sputtering on the passive rear side of the semiconductor chip.

The invention also provides a method for producing a semiconductor device, which method has the following steps. A circuit carrier is provided, which has at least one chip island. Furthermore, at least one semiconductor chip having a three-layer metallization according to one of the preceding embodiments is provided. At least one semiconductor chip is applied on the chip island of the circuit carrier, the three-layer metallization being in direct contact with the chip island. A connection between the semiconductor chip and the chip island is produced by the formation of intermetallic phases in the diffusion solder layer. The semiconductor chip is mechanically and electrically connected to the chip island by way of the composite produced.

In one form of implementation, the connection is produced at a temperature of between 200° C. and 400° C. In one embodiment, the chip island has Cu or a Cu-based alloy. The Cu or the Cu-based alloy of the chip island forms intermetallic phases with the material of the diffusion solder layer. A leadframe may be provided as the circuit carrier, the leadframe having the chip island and a plurality of leads.

The method for producing a semiconductor device may have the following additional steps according to the invention. After the semiconductor chip has been mounted on the chip island, electrical connections are produced between the top side of the semiconductor chip and the leads of the leadframe. Afterward, the semiconductor chip, the chip island, the electrical connections and inner regions of the leads are embedded in a plastic housing composition. The plastic housing composition forms the semiconductor device housing.

The electrical connections may be produced by means of one or more bonding wires and/or one or more contact clips.

In one embodiment, the semiconductor device has at least two semiconductor chips. The individual semiconductor chips may be mounted alongside one another on a single chip island. Each semiconductor chip may be mounted on the chip island simultaneously in one soldering method. As an alternative, a soldering method may be carried out separately for each semiconductor chip.

BRIEF DESCRIPTION OF THE DRAWINGS

The invention will now be explained in more detail with reference to the figures.

DETAILED DESCRIPTION

Figure 1:
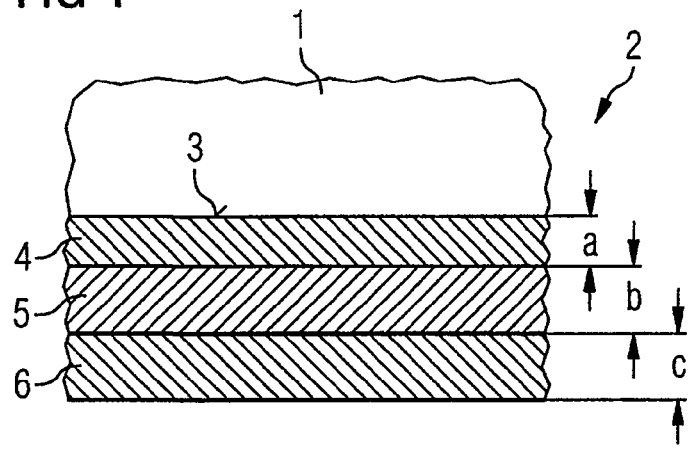
FIG. 1 shows a section of a semiconductor chip having an adhesion-promoting-free three-layer metallization.

FIG. 1 shows a section of a semiconductor chip 1 having an adhesion-promoting-free three-layer metallization 2 according to the invention. Only the rear side 3 of a semiconductor chip 1, which is part of a wafer (not shown), can be seen in FIG. 1.

The three-layer metallization 2 comprises an aluminum layer 4, a titanium layer 5 as a diffusion barrier layer and an AuSn or AgSn diffusion solder layer 6. The aluminum layer 4 has a thickness a, which is 1 μm in this embodiment and is arranged directly on the rear side 3 of the semiconductor chip 1. The aluminum layer 4 provides a low-resistance contact with the silicon of the semiconductor chip 1 and also has the effect of a buffer layer under loading due to thermal cycling. On account of different coefficients of thermal expansion, mechanical stresses can occur between the semiconductor chip 1 and a circuit carrier. Said mechanical stresses are at least partially compensated for by the aluminum layer 4, with the result that the reliability of the semiconductor device is improved.

The titanium layer 5 is arranged directly on the aluminum layer 4 and has a thickness b, which is 1 μm in this embodiment. According to the invention, the diffusion solder layer 6 having AuAn or AgSn is arranged directly on the titanium layer. No additional adhesion promoting layer is arranged between the diffusion barrier layer 5 and the diffusion solder layer 6.

According to the invention, the three layers 4, 5, 6 of the metallization 2 were sputtered onto the rear side 3 of a wafer having a plurality of semiconductor chips in a process sequence. Firstly, the aluminum layer 4 was sputtered with a thickness of 1 μm directly onto the rear side 3. The titanium layer 5 was then sputtered with a thickness of 1 μm directly onto the aluminum layer 4. Afterward, the diffusion solder layer 6 was sputtered directly onto the titanium layer 5. The diffusion solder layer 6 has a thickness c, which is 2 μm in this embodiment.

The three layers 4, 5, 6 of the metallization 2 were applied by sputtering on the rear side 3 of a plurality of semiconductor chips 1 of the wafer in a process sequence without air being admitted into the sputtering chamber. After the metallization 2 has been applied by sputtering on the rear side 3 of the wafer, the semiconductor chips 1 are singulated from the wafer.

The method according to the invention has the advantage that the diffusion solder layer 6 adheres well on the titanium layer 5, so that it is possible to dispense with an additional adhesion promoting layer between the titanium layer 5 and the diffusion solder layer 6. The boundary region between the diffusion solder layer 6 and the diffusion barrier layer 5 is free of intermetallic phases. This has the advantage that the composition of the diffusion solder layer 6 is not changed by the growth of intermetallic phases during the production method. Consequently, the melting point of the diffusion solder layer 6 is not influenced.

Figure 2:
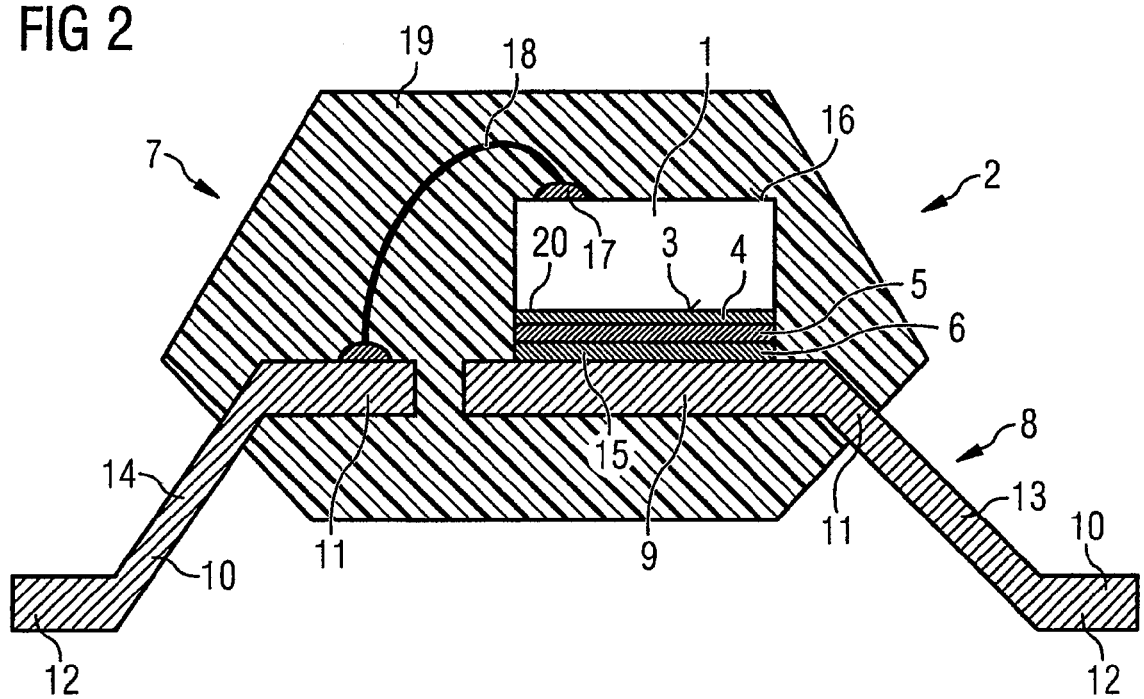
FIG. 2 shows a semiconductor device having a semiconductor chip having the metallization of FIG. 1.

FIG. 2 shows a semiconductor device 7 having a semiconductor chip 1 produced with the metallization of FIG. 1. The semiconductor chip 1 is a vertical MOSFET device. The metallization 2 is arranged on the rear side 3 of the semiconductor chip 1. The rear side 3 of the semiconductor chip has a drain contact area 20 of the MOSFET.

The semiconductor device 7 has a leadframe 8 having a chip island 9 and a plurality of leads 10. The leads 10 in each case have an inner region 11 and an outer region 12. One of the leads 10 extends from the chip island 9 and provides a drain contact connection 13 of the semiconductor device 7. The further leads 14 are arranged alongside the chip island 9, and they are not directly mechanically connected to the chip island 9. The further leads 14 provide the source contact connection and the drain contact connection of the semiconductor device 7. The leadframe 8 has copper.

The rear side 3 of the semiconductor chip 1 is mounted on the chip island 9 of the leadframe 8 and electrically connected to the chip island 9 and the drain contact connection 13 by way of the metallization 2. The semiconductor chip 1 was mounted on the chip island 9 by means of a diffusion solder method. During this method, intermetallic phases 15 are formed in the diffusion solder layer 6 on account of the reaction between the liquid AuSn or AgSn diffusion solder layer and the copper surface 16 of the chip island 9. In the case of the semiconductor device 7, the diffusion solder layer 6 has the intermetallic reaction products 15 of the diffusion solder method.

The top side 16 of the semiconductor chip 1 has a source contact area 17 and a gate contact area (not shown in the cross section of FIG. 2), which are electrically connected to the leads 14 via bonding wires 18. The source contact area 17 is electrically connected to the source lead 14 via a bonding wire 18. The gate contact area is also electrically connected to the gate lead via a bonding wire.

The semiconductor chip 1, the chip island 9, the bonding wires 18 and the inner regions 11 of the leads 10 are embedded in a plastic housing composition 19. The outer regions 12 of the leads 10 also extend outside the plastic housing composition 19 and provide the external contacts of the semiconductor device 7. The semiconductor device 7 can be mounted on a printed circuit board by means of the outer regions 12 of the leads 10.

LIST OF REFERENCE SYMBOLS

1 Semiconductor chip
2 Three-layer metallization
3 Rear side of the semiconductor chip
4 Aluminum layer
5 Diffusion barrier layer
6 Diffusion solder layer
7 Semiconductor device
8 Leadframe
9 Chip island
10 Lead
11 Inner region of the lead
12 Outer region of the lead
13 Drain contact connection
14 Source contact connection
15 Intermetallic phases
16 Top side
17 Source contact area
18 Bonding wire
19 Plastic housing composition
20 Drain contact area

The invention claimed is:

1. A method for producing a semiconductor chip having an adhesion-promoting-layer-free three-layer metallization comprising:
   providing a semiconductor chip,
   sputtering an aluminum layer directly on the semiconductor chip,
   sputtering a diffusion barrier layer directly on the aluminum layer, Ti, Ni, Pt or Cr being applied as the diffusion barrier layer,
   sputtering a solder layer directly onto the diffusion barrier layer, a diffusion solder layer being applied as the solder layer, and
   all three layers being applied by sputtering in only one process sequence such that the aluminum layer, diffusion barrier layer, and solder are sputtered consecutively by the same sputtering apparatus.

2. The method as claimed in claim 1, wherein an Sn-based diffusion solder is applied by sputtering as the diffusion solder layer.

3. The method as claimed in claim 2, wherein the diffusion solder layer has AuSn, AgSn or CuSn.

4. The method as claimed in claim 1, wherein the diffusion solder layer is applied by sputtering with a thickness c, where $0.1\ \mu m \leq c \leq 10\ \mu m$.

5. The method as claimed in claim 1, wherein the diffusion barrier layer is applied by sputtering with a thickness b, where $0.1\ \mu m \leq b \leq 10\ \mu m$.

6. The method as claimed in claim 1, wherein the aluminum layer is applied by sputtering with a thickness a, where $0.1\ \mu m \leq a \leq 10\ \mu m$.

7. The method as claimed in claim 1, wherein a boundary region between the diffusion solder layer and the diffusion barrier layer is free of intermetallic phases.

8. The method as claimed in claim 1, wherein a vertical power semiconductor device is provided as the semiconductor chip.

9. The method as claimed in claim 8, wherein the vertical power semiconductor device is a MOSFET, an IGBT, a Schottky diode or a PIN diode.

10. The method as claimed in claim 1, wherein the semiconductor chip has an active top side and a passive rear side, the three-layer metallization being applied by sputtering on the passive rear side of the semiconductor chip.

11. The method of claim 1, wherein the sputtering of the aluminum layer, the diffusion barrier layer, and the solder layer are all performed while the semiconductor chip is not exposed to air.

12. The method of claim 1, wherein none of the aluminum layer, the diffusion barrier layer, and the solder layer are in contact with an adhesion layer.

13. A method for producing a semiconductor device, the method comprising:
   forming an aluminum layer directly on a semiconductor chip;
   forming a diffusion barrier layer directly on the aluminum layer, wherein the diffusion barrier layer comprises at least one of the following elements: Ti, Ni, Pt, and Cr;
   forming a diffusion solder layer directly onto the diffusion barrier layer, the aluminum layer, the diffusion barrier, and the diffusion solder layer together forming an adhesion-promoting-layer-free three-layer metallization, the boundary region between the diffusion solder layer and the diffusion barrier layer being free of intermetallic phases so that the composition of the diffusion solder layer remains unchanged during formation of the three-layer metallization;
   applying the semiconductor chip on a chip island of a circuit carrier, such that the three-layer metallization is applied directly on the chip island; and
   forming a connection between the semiconductor chip and the chip island by forming intermetallic phases from the surface materials of the chip island and the diffusion solder layer.

14. The method of claim 13, wherein the connection is produced while at a temperature of between 200° C. and 400° C.

15. The method of claim 13, wherein the chip island has Cu or a Cu-based alloy, the Cu or the Cu-based alloy forming intermetallic phases with the diffusion solder layer.

16. The method of claim 13, wherein the circuit carrier comprises a leadframe, the leadframe furthermore having a plurality of leads.

17. The method of claim 16, further comprising:
   producing electrical connections between the top side of the semiconductor chip and the leads of the leadframe; and
   embedding the semiconductor chip, the chip island, the electrical connections, and inner regions of the leads in a plastic housing composition.

18. The method of claim 17, wherein the electrical connections comprise bonding wires.

19. The method of claim 17, wherein the electrical connections comprise contact clips.

20. A method, comprising:
   sputtering an aluminum layer directly on a semiconductor chip;
   sputtering a diffusion barrier layer directly on the aluminum layer, wherein the diffusion barrier layer comprises at least one of the following elements: Ti, Ni, Pt, and Cr;
   sputtering a diffusion solder layer directly onto the diffusion barrier layer; and
   wherein the sputtering of the aluminum layer, diffusion barrier layer, and diffusion solder layer are all performed in only one process sequence such that the aluminum layer, diffusion barrier layer, and solder are sputtered consecutively by the same sputtering apparatus.

21. The method of claim 20, wherein the sputtering of the aluminum layer, the diffusion barrier layer, and the solder layer are all performed while the semiconductor chip is not exposed to air.

22. The method of claim 20, wherein none of the aluminum layer, the diffusion barrier layer, and the solder layer are in contact with an adhesion layer.

23. A method for producing a semiconductor chip having an adhesion-promoting-layer-free three-layer metallization comprising:
   providing a semiconductor chip,
   sputtering an aluminum layer directly on the semiconductor chip, sputtering a diffusion barrier layer directly on the aluminum layer, Ti, Ni, Pt or Cr being applied as the diffusion barrier layer,
   sputtering a diffusion solder layer with a thickness c, where $0.1\ \mu m \leqq c \leqq 10\ \mu m$, directly onto the diffusion barrier layer,
   all three layers being applied by sputtering in only one process sequence such that the aluminum layer, diffusion barrier layer, and solder are sputtered consecutively by the same sputtering apparatus, and
   wherein a boundary region between the diffusion solder layer and the diffusion barrier layer is free of intermetallic phases.

24. A method for producing a semiconductor device, the method comprising:
   forming an aluminum layer directly on a semiconductor chip;
   forming a diffusion barrier layer directly on the aluminum layer, wherein the diffusion barrier layer comprises at least one of the following elements: Ti, Ni, Pt, and Cr;
   forming a diffusion solder layer directly onto the diffusion barrier layer, wherein the diffusion solder layer comprises an Sn-based diffusion solder, the aluminum layer, the diffusion barrier layer, and the diffusion solder layer together forming an adhesion-promoting-layer-free three-layer metallization, the area between the diffusion solder layer and the diffusion barrier layer being free of intermetallic phases such that the composition of the diffusion solder layer is not changed during formation of the three-layer metallization;
   applying the semiconductor chip on a chip island of a circuit carrier, such that the three-layer metallization is applied directly on the chip island, the chip island comprising Cu or a Cu-based alloy; and
   forming a connection between the semiconductor chip and the chip island by forming intermetallic phases from the material of the surface of the chip island and the material of the diffusion solder layer.

25. The method as claimed in claim 24, wherein the diffusion solder layer comprises AuSn.

26. The method as claimed in claim 24, wherein the diffusion solder layer comprises AgSn.

27. The method as claimed in claim 24, wherein the diffusion solder layer comprises CuSn.

* * * * *

UNITED STATES PATENT AND TRADEMARK OFFICE
CERTIFICATE OF CORRECTION

PATENT NO. : 8,324,115 B2
APPLICATION NO. : 11/555891
DATED : December 4, 2012
INVENTOR(S) : Ralf Otremba et al.

Page 1 of 1

It is certified that error appears in the above-identified patent and that said Letters Patent is hereby corrected as shown below:

On the title page, item [30], under Foreign Application Priority Data:
Delete "10 2005 052 563" and insert --10 2005 052 563.6--

In the Claims
Column 8, Claim 14, Line 36:
Delete "200° C. and" and insert --200° C and--

Signed and Sealed this
Seventeenth Day of December, 2013

Margaret A. Focarino
*Commissioner for Patents of the United States Patent and Trademark Office*